United States Patent [19]
Kanbe et al.

[11] Patent Number: 4,536,460
[45] Date of Patent: Aug. 20, 1985

[54] PHOTOCONDUCTIVE MEMBER

[75] Inventors: Junichiro Kanbe, Yokohama; Shigeru Shirai, Yamato; Teruo Misumi, Kawasaki; Keishi Saitoh, Tokyo; Yoichi Osato, Yokohama, all of Japan

[73] Assignee: Canon Kabushiki Kaisha, Tokyo, Japan

[21] Appl. No.: 437,282

[22] Filed: Oct. 28, 1982

[30] Foreign Application Priority Data

Nov. 9, 1981 [JP] Japan ................................ 56-179434
Nov. 13, 1981 [JP] Japan ................................ 56-182655
Nov. 13, 1981 [JP] Japan ................................ 56-182656

[51] Int. Cl.³ .......................................... G03G 5/082
[52] U.S. Cl. ..................................... 430/57; 430/95; 252/501.1; 427/74; 357/2
[58] Field of Search ...................... 430/57, 84, 85, 86, 430/95; 252/501.1; 427/74; 357/2

[56] References Cited

U.S. PATENT DOCUMENTS

| 3,210,184 | 10/1965 | Uhlig | 430/65 |
| 4,217,374 | 8/1980 | Ovshinsky et al. | 430/84 X |
| 4,226,898 | 10/1980 | Ovshinsky et al. | 430/84 X |
| 4,251,289 | 2/1981 | Moustakas et al. | 204/192 |
| 4,253,882 | 3/1981 | Dalal | 427/74 X |
| 4,265,991 | 5/1981 | Hirai et al. | 430/65 X |
| 4,289,822 | 9/1981 | Shimada et al. | 427/74 X |

FOREIGN PATENT DOCUMENTS

| 3040972 | 5/1981 | Fed. Rep. of Germany | 430/95 |
| 56-64347 | 6/1981 | Japan | 430/57 |

Primary Examiner—Roland E. Martin
Attorney, Agent, or Firm—Fitzpatrick, Cella, Harper & Scinto

[57] ABSTRACT

A photoconductive member comprising a support and a silicon amorphous layer, and the silicon amorphous layer has a first layer region containing at least one of oxygen, nitrogen and carbon and a second layer region containing an element of Group III. The first layer exists internally within the amorphous layer below its surface.

41 Claims, 2 Drawing Figures

PHOTOCONDUCTIVE MEMBER

BACKGROUND OF THE INVENTION

1. Field of the Invention

This invention relates to a photoconductive member having sensitivity to electromagnetic waves such as light [herein used in a broad sense, including ultraviolet rays, visible light, infrared rays, X-rays, gamma-rays and the like].

2. Description of the Prior Arts

Photoconductive materials, which constitute solid image pick-up devices, or image forming members for electrophotography and manuscript reading apparatuses in the field of image formation, are required to have a high sensitivity, a high SN ratio [Photocurrent ($I_p$)/Dark current ($I_d$)], spectral characteristics matching to those of electromagnetic waves to be irradiated, a rapid response to light, a desired dark resistance value and no harm to human bodies during usage. Further, in a solid state image pick-up device, it is also required that the residual image should easily be treated within a predetermined time. In particular, in case of an image forming member for electrophotography to be assembled in an electrophotographic device to be used in an office as an office business machine, the aforesaid harmless characteristic is very important.

From the standpoint as mentioned above, amorphous silicon [hereinafter referred to as "a-Si"] has recently attracted attention as a photoconductive material. For example, German Laid-Open Patent Publication Nos. 2746967 and 2855718 disclose applications of a-Si for use in image forming members for electrophotography, and German Laid-Open Patent Publication No. 2933411 discloses an application of a-Si for use in a photoelectric transducer reading device.

However, under the present situation, the photoconductive members having photoconductive layers constituted of a-Si of the prior art are required to be improved with respect to combined characteristics, including various electrical, optical and photoconductive characteristics such as dark resistance value, photoconductivity and response to light, environmental characteristics in use such as humidity resistance, and further stability with lapse of time.

For instance, when the a-Si photoconductive member is applied to an image forming member of an electrophotographic device, residual potential is frequently observed to remain during use thereof. When such a photoconductive member is repeatedly used for a long time, there will be caused various inconveniences such as accumulation of fatigues by repeated uses, so called ghost phenomenon resulting from the accumulation of fatigues wherein residual images are formed, and the like.

Further, according to the experience by the present inventors from a number of experiments, a-Si materials constituting the photoconductive layer of an image forming member for electrophotography have a number of advantages, as compared with inorganic photoconductive materails such as Se, CdS, ZnO and the like or organic photoconductive materials such as PVCz, TNF and the like of the prior art, but it is also found that they have several problems to be solved. Namely, when charging treatment is applied, for formation of electrostatic images, to the photoconductive layer of an image forming member for electrophotography having a photoconductive member constituted of a mono-layer of a-Si which has been endowed with characteristics for use in a solar battery of the prior art, dark decay is markedly rapid, whereby it is difficult to apply a conventional electrophotographic method. This tendency is further pronounced under a humid atmosphere to such an extent, in some cases, that charge can not be retained at all until development.

Further, a-Si materials may contain, as constituent atoms, hydrogen atoms or halogen atoms such as fluorine atoms, chlorine atoms, and the like, for improving their electrical and photoconductive characteristics, boron atoms, phosphorus atoms, and the like, for controlling the electroconduction type, and other atoms for improving other characteristics. Depending on the manner in which these constituent atoms are contained, there may be caused problems sometimes with respect to mechanical characteristics after layer formation.

That is, for example, in the case of an image forming member for electrophotography, an a-Si layer is formed on a cylindrical support made of a metallic material such as aluminum, and the like. Due to its large strain characteristic, there will frequently occur inconveniences such as formation of cracks in the layer, loosening of the layer from on the support or peel-off of the layer as a whole, although the problems may depend on the conditions for preparation of the layer.

Further, an ordinary a-Si layer per se does not generally exhibit good characteristic with respect to adhesion to a support made of a metallic material such as aluminum and the like and therefore there is a problem in the characteristic of repeated uses for a long term. There is also a problem that good electrical contact can be formed with difficulty between the support and the a-Si layer, and further it is subjected to change with lapse of time.

Thus, it is desired in designing a photoconductive material to make efforts to obtain desirable electrical and photoconductive characteristics along with the improvement in a-Si materials per se.

SUMMARY OF THE INVENTION

The present invention has been achieved to solve the above mentioned problems. The studies have been made comprehensively from the standpoints of applicability and utility of a-Si as a photoconductive member for image forming members for electrophotography, solid image pick-up devices and reading apparatuses. It has now been found that a photoconductive member having a photoconductive layer comprising an amorphous layer exhibiting photoconductivity which is constituted of so called hydrogenated amorphous silicon, halogenated amorphous silicon or halogen-containing hydrogenated amorphous silicon which is an amorphous material containing at least one of hydrogen atom (H) and halogen atom (X) in a matrix of silicon [hereinafter referred to comprehensively as a-Si(H,X)], said photoconductive member being prepared by designing so as to have a specific layer structure, exhibits not only practically extremely excellent characteristics but also surpass the photoconductive members of the prior art in substantially all respects, especially exhibiting markedly excellent characteristics as a photoconductive member for electrophotography. The present invention is based on such a finding.

The primary object of the present invention is to provide a photoconductive member having constantly stable electrical, optical and photoconductive characteristics, which is an all-environment type substantially without limitations with respect to the environment under which it is used, being markedly excellent in light-resistant fatigue without deterioration after repeated uses and free entirely or substantially from residual potentials observed.

Another object of the present invention is to provide a photoconductive member, which is sufficiently capable of bearing charges at the time of charging treatment for formation of electrostatic charges to the extent such that a conventional electrophotographic method can be very effectively applied when it is provided for use as an image forming member for electrophotography.

Still another object of the present invention is to provide a photoconductive member for electrophotography capable of providing easily a high quality image which is high in density, clear in halftone and high in resolution.

A further object of the present invention is to provide a photoconductive member having high photosensitivity, high adhesion and good electrical contact with the support.

According to the present invention, there is provided a photoconductive member comprising a support for a photoconductive member and an amorphous layer having photoconductivity constituted of an amorphous material comprising silicon atoms as a matrix, characterized in that said amorphous layer has a first layer region containing at least one kind of atoms selected from the group consisting of oxygen atoms, nitrogen atoms and carbon atoms as constituent atoms and a second layer region containing atoms of an element belonging to the group III of the periodic table as constituent atoms, said first layer region exsisting internally within said amorphous layer below the surface of said amorphous layer.

DESCRIPTION OF THE PREFERRED EMBODIMENTS

Figure 1:
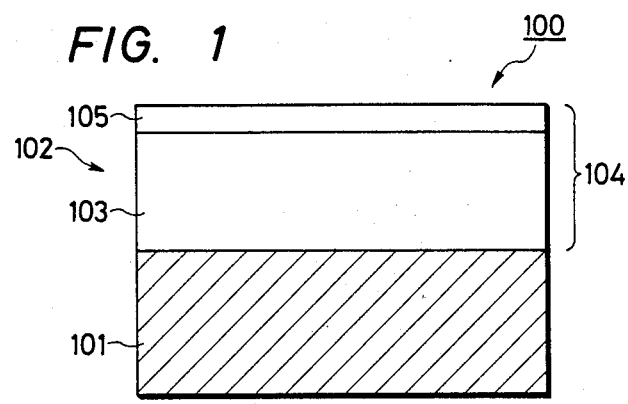
FIG. 1 shows a schematic sectional view for illustration of the layer constitution of the photoconductive member according to the present invention.

Referring now to the drawing, the photoconductive members according to the present invention will be described in detail below.

FIG. 1 shows a schematic sectional view for illustration of a typical exemplary constitution of the photoconductive member of this invention.

A photoconductive member 100 as shown in FIG. 1 has a support 101 for photoconductive member and an amorphous layer 102 comprising a-Si(H,X) having photoconductivity provided on support 101, amorphous layer 102 having a layer structure constituted so as to have a first layer region 103 containing at least one kind of atoms selected from the group consisting of oxygen atoms, nitrogen atoms and carbon atoms as constituent atoms and a second layer region 104 containing atoms of an element belonging to the group III of the periodic table as constituent atoms. In the example as shown in FIG. 1, the second layer region 104 occupies the whole region of the amorphous layer 102, while the first layer region constitutes a part of the second layer region 104. Thus, the first layer region 103 exists internally within the amorphous layer 102 below its surface, that is, the first layer region 103 does not appear on the surface of the amorphous layer.

In an upper layer region 105 of the amorphous layer 102, there is contained no oxygen atom which is considered to be a factor having influence on humidity resistance, corona ion resistance, but oxygen atoms are contained only in the first layer region 103.

By incorporation of at least one kind of atoms selected from oxygen atoms, nitrogen atoms and carbon atoms to the first layer region 103, improvements primarily with respect to higher dark resistance and adhesion are intended, while the improvement primarily with respect to higher sensitivity without incorporation of any of these atoms in upper layer 105 of the second region 104. The oxygen atoms, nitrogen atoms or carbon atoms may be contained in the first layer region 103 in an amount which may be suitably determined as desired depending on the characteristics required for the photoconductive member formed.

When oxygen atoms are contained in the first layer region 103, oxygen atoms are preferably in an amount of 0.01 to 20 atomic %, more preferably 0.02 to 10 atomic %, most preferably 0.03 to 5 atomic %, based on the first layer region.

When nitrogen atoms are contained in the first layer region 103, nitrogen atoms are preferably in an amount of 0.01 to 20 atomic %, more preferably 0.02 to 7 atomic %, most preferably 0.03 to 3 atomic %, based on the first layer region.

When carbon atoms are contained in the first layer region 103, carbon atoms are preferably in an amount of 0.01 to 20 atomic %, more preferably 0.02 to 5 atomic %, most preferably 0.03 to 1 atomic %, based on the first layer region.

When two or more kinds of oxygen atoms, nitrogen atoms and carbon atoms are to be contained in the first layer region 103 constituting a part of the amorphous layer 102 in the photoconductive member according to the present invention, the contents of the respective atoms in the first layer region 103 may be desired to be such that the sum of the contents is 0.01 to 20 atomic %.

As to the content of the atoms of an element belonging to the group III of the periodic table to be contained in the second layer region 104, it may be also suitably determined as desired similarly in the case of the contents of the atoms to be contained in the first layer region 103 as mentioned above. The content ranges generally from 0.01 to $5 \times 10^4$ atomic ppm, preferably from 1 to 100 atomic ppm, more preferably from 2 to 50 atomic ppm, most preferably from 3 to 20 atomic ppm, based on the second layer region.

Thickness of the first layer region 103 and that of the upper layer region 105 are one of important factors in accomplishing effectively the object of the present invention, and therefore they should be carefully determined upon designing of the photoconductive member so as to impart desired characteristics to the photoconductive member.

In the present invention, the layer thickness of the first layer region 103 is intimately related with the layer thickness of the amorphous layer 102 per se. The first layer region 103 is generally desired to have a thickness of 3 to 100μ, preferably of 5 to 50μ, most preferably of 7 to 30μ.

The upper layer region 105 may have generally a thickness of 0.02 to 10μ, preferably of 0.03 to 5μ, most preferably of 0.05 to 2μ.

According to the present invention, the photoconductive member may be as shown in FIG. 1 wherein atoms of an element of the group III are contained also in the upper layer region 105 and the amorphous layer 102 is made wholly as the second layer region 104. As another embodiment, it is also possible to make the upper layer region devoid of atoms of an element of the group III while making the first and the second layer regions as the same layer region.

In such an embodiment of the photoconductive member wherein no atom of an element of the group III is incorporated in the upper layer region, there can be obtained remarkably good characteristics especially in repeated uses under a highly humid atmosphere and sufficient durability during use for a long term in said atmosphere. Also, as a further example of the preferred embodiments, there may be mentioned a case wherein a second layer region is formed within a first layer region.

Further, according to the present invention, there may be provided between the support 101 and the first layer region 103 an intermediate layer comprising a metal oxide such as $Al_2O_3$ and the like which can function as so-called electrical barrier.

In the present invention, the atoms belonging to the group III of the periodic table to be incorporated in the second layer region may include B, Al, Ga, In and Tl. Among them, B and Ga are particularly preferred.

The support may be either electroconductive or insulating. As the electroconductive material, there may be mentioned metals such as NiCr, stainless steel, Al, Cr, Mo, Au, Nb, Ta, V, Ti, Pt, Pd, etc. or alloys thereof.

As the insulating support, there may be conventionally used films or sheets of synthetic resins, including polyester, polyethylene, polycarbonate, cellulose acetate, polypropylene, polyvinyl chloride, polyvinylidene chloride, polystyrene, polyamide, and the like, glasses, ceramics, papers and the like. These insulating supports may suitably have at least one surface subjected to an electroconductivizing treatment, and it is desirable to provide other layers on the side to which said electroconductivizing treatment has been applied.

For example, a glass can be electroconductivized by providing a thin film of NiCr, Al, Cr, Mo, Au, Ir, Nb, Ta, V, Ti, Pt, Pd, $In_2O_3$, $SnO_2$, ITO ($In_2O_3+SnO_2$) thereon. Alternatively, the surface of a synthetic resin film such as polyester film and the like can be electroconductivized by vacuum vapor deposition, electron-beam deposition or sputtering of a metal such as NiCr, Al, Ag, Pb, Zn, Ni, Au, Cr, Mo, Ir, Nb, Ta, V, Ti, Pt, and the like or by laminating said metal on the surface. The support may be shaped in any form such as cylinders, belts, plates or others, and its form may be determined as desired. For example, when the photoconductive member 100 in FIG. 1 is to be used as an image forming member for electrophotography, it may be desirably formed into an endless belt or a cylinder for use in continuous high speed copying. The support may have a thickness, which is conveniently determined so that a photoconductive member as desired may be formed. When the photoconductive member is required to have a flexibility, the support is made as thin as possible, so far as the function of a support can be retained. However, in such a case, the thickness is generally 10$\mu$ or more from the viewpoints of fabrication and handling of the support as well as its mechanical strength.

In the present invention, typical examples of halogen atoms (X) to be incorporated in the amorphous layer if desired are fluorine, chlorine, bromine and iodine, especially preferably fluorine and chlorine.

In the present invention, formation of the amorphous layer constituted of a-Si:(H, X) may be conducted according to a vacuum deposition method utilizing discharging phenomenon, such as glow discharge method, sputtering method, ion-plating method and the like. For example, for formation of the amorphous layer constituted of a-Si:(H, X) according to a glow discharge method, a starting gas for introduction of hydrogen atoms and/or halogen atoms is introduced together with a starting gas for supplying silicon atoms (Si) into a deposition chamber which can be brought to a reduced pressure, wherein glow discharge is generated to form a layer of a-Si:(H, X) on the surface of a support placed at a predetermined position in the chamber. When the amorphous layer is to be formed according to a sputtering method, a starting gas for introduction of hydrogen atoms and/or halogen atoms may be introduced into a chamber for sputtering upon effecting sputtering by using the target formed of silicon (Si) in an atmosphere of an inert gas such as Ar, He and the like or a gas mixture based on these inert gases.

The starting gas for supplying Si to be used in the present invention may include gaseous or gasifiable silicon hydrides (silanes) such as $SiH_4$, $Si_2H_6$, $Si_3H_8$, $Si_4H_{10}$ and the like as effective materials. In particular, $SiH_4$ and $Si_2H_6$ are preferred with respect to easy handling during layer formation and efficiency for supplying Si.

As an effective starting gas for incorporation of halogen atoms to be used in the present invention, there may be mentioned a number of halogen compounds such as halogen gases, halides, interhalogen compounds and silane derivatives substituted with halogens which are gaseous or gasifiable.

Alternatively, it is also effective in the present invention to use a gaseous or gasifiable silicon compound containing halogen atoms which is constituted of both silicon atoms and halogen atoms.

Typical examples of halogen compounds preferably used in the present invention may include halogen gases such as fluorine, chlorine, bromine and iodine and interhalogen compounds such as BrF, ClF, $ClF_3$, $BrF_5$, $BrF_3$, $IF_3$, $IF_7$, ICl, IBr, and the like.

As the silicon compound containing halogen atom, that is, silane derivatives substituted with halogen atoms, silicon halides such as $SiF_4$, $Si_2F_6$, $SiCl_4$, $SiBr_4$, and the like are preferred.

When the specific photoconductive member of this invention is formed according to the glow discharge method by use of such a silicon compound containing halogen atoms, it is possible to form a photoconductive layer constituted of a-Si:X on a given support without use of a hydrogenated silicon gas as the starting gas capable of supplying Si.

In forming the amorphous layer containing halogen atoms according to a glow discharge method, the basic procedure comprises feeding a starting gas for supplying Si, for example, a gas of silicon halide and a gas such as Ar, $H_2$, He, etc. at a predetermined ratio in a suitable amount into the deposition chamber for formation of an amorphous layer, followed by excitation of glow discharge to form a plasma atmosphere of these gases, thereby forming the amorphous layer on a support. It is also possible to form the amorphous layer by mixing a gas of a silicon compound containing hydrogen atoms at a suitable ratio with these gases in order to incorporate hydrogen atoms therein.

Each of the gases for introduction of respective atoms may be either a single species or a mixture of plural species at a predetermined ratio.

For formation of a photoconductive layer of a-Si(H, X) by a reactive sputtering method or an ion-plating method, there may be conducted as shown below. A target of Si is used for sputtering in a suitable gas plasma atmosphere in case of the sputtering method. Alternatively, in case of an ion-plating method, a polycrystalline or single crystalline silicon is placed, as a vaporization source, in an evaporation boat, and the silicon vaporization source is vaporized by heating by a resistance heating method or an electron beam method (EB method) to permit the vaporized flying substances to pass through a suitable gas plasma atmosphere.

During this procedure, in either of the sputtering method or the ion-plating method, for introduction of halogen atoms into the layer formed, a gas of a halogen compound as mentioned above or a silicon compound containing halogen as mentioned above may be introduced into the deposition chamber to form a plasma atmosphere of said gas therein.

When hydrogen atoms are introduced, a starting gas for introduction of hydrogen atoms such as $H_2$, silanes as mentioned above and the like may be introduced into the deposition chamber for sputtering, followed by formation of a plasma atmosphere of said gases.

In the present invention, as the starting gas for introduction of halogen atoms, the halogen compounds or silicon compounds containing halogens as mentioned above can be effectively used. In addition, it is also possible to use a gaseous or gasifiable halide containing hydrogen atom as one of the constituents such as hydrogen halide, including HF, HCl, HBr, HI and the like or halo-substituted hydrogenated silicon, including $SiH_2F_2$, $SiH_2I_2$, $SiH_2Cl_2$, $SiHCl_3$, $SiH_2Br_2$, $SiHBr_3$ and the like as an effective starting material for formation of an amorphous layer.

These halides containing hydrogen atom capable of introducing hydrogen atoms which are very effective for controlling electrical or optical characteristics into the amorphous layer during the formation of the amorphous layer simultaneously with introduction of halogen atoms can be preferably used as the starting material for introduction of halogen atoms.

For incorporation of hydrogen atoms structurally into the amorphous layer, $H_2$ or a gas of hydrogenated silicon such as $SiH_4$, $Si_2H_6$, $Si_3H_8$, $Si_4H_{10}$ and the like may be permitted to coexist with a silicon compound for supplying Si in a deposition chamber, wherein discharging is excited.

For example, in case of the reactive sputtering method, an Si target is used and a gas for introduction of halogen atoms and $H_2$ gas are introduced, if desired, together with an inert gas such as He, Ar, and the like into a deposition chamber, wherein a plasma atmosphere is formed to effect sputtering by using said Si target, thereby forming an amorphous layer of a-Si(H, X) on the substrate.

Further, there may also be introduced a gas such as $B_2H_6$ and the like in order to effect also doping with impurities.

The amount of hydrogen atoms (H) or halogen atoms (X) contained in the amorphous layer in the photoconductive member according to the present invention, or total amount of both of these atoms, may be generally 1 to 40 atomic %, preferably 5 to 30 atomic %.

For the purpose of controlling the amounts of hydrogen atoms (H) and/or halogen atoms (X) in the photoconductive layer, the deposition support temperature and/or the amounts of the starting materials for incorporation of hydrogen atoms (H) or halogen atoms (X) to be introduced into the deposition device system, or the discharging power may be controlled.

For formation of a second layer region and a first layer region by introducing atoms of the group III and at least one kind of atoms selected from oxygen atoms, nitrogen atoms and carbon atoms, respectively, into the amorphous layer, a starting material for introduction of the atoms of the group III, or a starting material for introduction of oxygen atoms, for introduction of nitrogen atoms or for introduction of carbon atoms, or plural kinds of those starting materials may be used together with a starting material for formation of an amorphous layer, while controlling their amounts to be incorporated in the layer formed.

When a glow discharge method is used for formation of a first layer region constituting the amorphous layer, the starting material for formation of the first layer region may be selected from those for formation of the amorphous layer as described above and at least one of the starting materials for introducing oxygen atoms, nitrogen atoms and carbon atoms are added thereto.

As the starting material for introduction of oxygen atoms among such starting gases for formation of the first layer region, there may be employed most of gaseous substances or gasified gasifiable substances containing oxygen atoms as constituent atoms.

For example, it is possible to use a mixture of a starting gas having silicon atoms (Si) as constituent atoms, a starting gas having oxygen atoms (O) as constituent atoms and, if necessary, a gas having hydrogen atoms (H) and/or halogen atoms (X) as constituent atoms at a desired mixing ratio. Alternatively, a mixture of a starting gas having silicon atoms (Si) as constituent atoms and a starting gas having oxygen atoms (O) and hydrogen atoms (H) as constituent atoms at a desired mixing ratio can also be used. Further, it is also possible to use a mixture of a starting gas having silicon atoms (Si) as constituent atoms and a starting gas having the three kind of atoms of silicon atoms (Si), oxygen atoms (O) and hydrogen atom (H) as constituent atoms.

As another method, it is also possible to use a mixture of a starting gas having silicon atoms (Si) and hydrogen atoms (H) as constituent atoms and a starting gas having oxygen atoms (O) as constitutent atoms.

As the materials for introducing oxygen atoms, there may be mentioned oxygen ($O_2$), ozone ($O_3$), nitrogen monoxide(NO), nitrogen dioxide ($No_2$), dinitrogen oxide ($N_2O$), dinitrogen trioxide ($N_2O_3$), dinitrogen tetraoxide ($N_2O_4$), dinitrogen pentoxide ($N_2O_5$), nitrogen trioxide ($NO_3$), lower siloxanes containing Si, O and H as constituent atoms such as disiloxane ($H_3SiOSiH_3$), trisiloxane ($H_3SiOSiH_2OSiH_3$), and the like.

As the starting materials for introduction of nitrogen atoms, there may be employed most of gaseous substances or gasified gasifiable substances containing nitrogen atoms as constituent atoms.

For example, it is possible to use a mixture of a starting gas having silicon atoms (Si) as constituent atoms, a starting gas having nitrogen atoms (N) as constituent atoms and, if necessary, a gas having hydrogen atoms (H) and/or halogen atoms (X) as constituent atoms at a desired mixing ratio. Alternatively, a mixture of a starting gas having silicon atoms (Si) as constituent atoms and a starting gas having nitrogen atoms (N) and hydrogen atoms (H) as constituent atoms at a desired mixing ratio can also be used. Further, it is also possible to use a mixture of a starting gas having silicon atoms (Si) as constituent atoms and a starting gas having the three kind atoms of silicon atoms (Si), nitrogen atoms (N) and hydrogen atoms (H) as constituent atoms.

As another method, it is also possible to use a mixture of a starting gas having silicon atoms (Si) and hydrogen atoms (H) as constituent atoms and a starting gas having nitrogen atoms (N) as constituent atoms.

As the starting materials for forming starting gases for the introduction of nitrogen atoms, there may be mentioned gaseous or gasifiable nitrogen compounds such as nitrogen, nitrides, azides and the like, for example, nitrogen ($N_2$), ammonia ($NH_3$), hydrazine ($H_2NNH_2$), hydrogen azide ($HN_3$), ammonium azide ($NH_4N_3$), and the like.

Furthermore, for the advantage of introducing halogen atoms as well as nitrogen atoms, there may be also employed halogen containing nitrogen compounds such as nitrogen trifluoride ($F_3N$), nitrogen tetrafluoride ($F_4N_2$), dinitrogen difluoride ($N_2F_2$), fluorine azide ($FN_3$), chlorine azide ($ClN_3$), bromine azide ($BrN_3$), hydrazinium azide ($N_2H_5N_3$), and the like.

As the starting materials for the introduction of carbon atoms, there may be employed most of gaseous substances or gasified gasifiable substances containing carbon atoms as constituent atoms.

For example, it is possible to use a mixture of a starting gas having silicon atoms (Si) as constituent atoms, a starting gas having carbon atoms (C) as constituent atoms and, if necessary, a gas having hydrogen atoms (H) and/or halogen atoms (X) as constituent atoms at a desired mixing ratio. Alternatively, a mixture of a starting gas having silicon atoms (Si) as constituent atoms and a starting gas having carbon atoms (C) and hydrogen atoms (H) as constituent atoms at a desired mixing ratio can be also used. Further, it is also possible to use a mixture of a starting gas having silicon atoms (Si) as constituent atoms and a starting gas having the three kind atoms of silicon atoms (Si), carbon atoms (C) and hydrogen atoms (H) as constitutent atoms.

As another method, it is also possible to use a mixture of a starting gas having silicon atoms (Si) and hydrogen atoms (H) as constituent atoms and a starting gas having carbon atoms (C) as constituent atoms.

The starting materials for forming starting gases for the introduction of carbon atoms may include hydrocarbons composed of C and H atoms such as saturated hydrocarbons having 1 to 5 carbon atoms, ethylenic hydrocarbons having 2 to 5 carbon atoms or acetylenic hydrocarbons having 2 to 4 carbon atoms.

More specifically, typical examples of the hydrocarbons are saturated hydrocarbons such as methane ($CH_4$), ethane ($C_2H_6$), propane ($C_3H_8$), n-butane (n-$C_4H_{10}$), pentane ($C_5H_{12}$), and the like; ethylenic hydrocarbons such as ethylene ($C_2H_4$), propylene ($C_3H_6$), butene-1 ($C_4H_8$), butene-2 ($C_4H_8$), isobutylene ($C_4H_8$), and the like; and acetylenic hydrocarbons such as acetylene ($C_2H_2$), methylacetylene ($C_3H_4$), butyne ($C_4H_6$), and the like.

Typical examples of the starting gas constituted of Si, C and H are alkyl silanes such as $Si(CH_3)_4$, $Si(C_2H_5)_4$ and the like.

Furthermore, for the advantage of introducing halogen atoms as well as carbon atoms, there may be also effectively employed halo-substituted paraffinic hydrocarbons such as $CCl_4$, $CHF_3$, $CH_2F_2$, $CH_3F$, $CH_3Cl$, $CH_3Br$, $CH_3I$, $C_2H_5Cl$, and the like, and halogen containing alkyl silanes such as $SiCl(CH_3)_3$, $SiCl_2(CH_3)_2$, $SiCl_3CH_3$, and the like.

For formation of a first layer region containing oxygen atoms according to a sputtering method, a single crystalline Si wafer or $SiO_2$ wafer or a wafer containing Si and $SiO_2$ mixed therein may be used as target and sputtering may be effected in various gas atmospheres.

For example, when an Si wafer is used as a target, a starting gas for introducing oxygen and, if desired, together with a starting gas for incorporation of hydrogen atoms and/or halogen atoms, which may be diluted with a diluting gas if desired, is introduced into a deposition chamber for sputtering, and a gas plasma of these gases is formed and the sputtering is effected by using the Si wafer.

Alternatively, with the use of Si and $SiO_2$ as separate targets or with the use of a target of one sheet of a mixture of Si and $SiO_2$, sputtering may be effected in a diluted gas atmosphere as a gas for sputtering or in a gas atmosphere containing at least hydrogen atoms (H) and/or halogen atoms (X) as constituent atoms. As the starting gases for the introduction of oxygen atoms in sputtering, there may be also employed those for the introduction of oxygen atoms used in glow discharge as mentioned above.

For formation of a first layer region containing nitrogen atoms by a sputtering method, a single crystalline or polycrystalline Si wafer or $Si_3N_4$ wafer or a wafer containing both Si and $Si_3N_4$ used as a target and is sputtered in an atmosphere of various gases.

For example, when Si wafer is used as a target, a starting gas for the introduction of nitrogen atoms and, if necessary, a starting gas for incorporating hydrogen atoms and/or halogen atoms, which may be diluted with a diluting gas, if desired, is introduced into a deposition chamber for sputtering to form a gas plasma and effect sputtering by using said Si wafer.

Alternatively, Si and $Si_3N_4$ as separate targets or one sheet target of a mixture of Si and $Si_3N_4$ can be used and sputtering is effected in a diluted gas atmosphere as a gas for sputtering or a gas atmosphere containing hydrogen atoms (H) and/or halogen atoms (X). As the starting gas for the introduction of nitrogen atoms in the case of sputtering, there may be also employed those for the introduction of nitrogen atoms exemplified in the case of glow discharge as mentioned above.

For formation of a first layer region containing carbon atoms by a sputtering method, a single crystalline or polycrystalline Si wafer and C wafer, or a wafer containing Si and C mixed therein can be used as target and sputtering is effected in an atmosphere of various gases.

For example, when an Si wafer is used as target, a starting gas for introduction of carbon atoms and, if desired, a starting gas for incorporating hydrogen atoms and/or halogen atoms, which may be diluted with a diluting gas, if desired, is introduced into a deposition chamber for sputtering to form a gas plasma therein and effect sputtering by using said Si wafer.

Alternatively, Si and C as separate targets or one sheet target of a mixture of Si and C can be used and sputtering is effected in a diluting gas as a sputtering atmosphere, or in a gas atmosphere containing at least hydrogen atoms (H) and/or halogen atoms (X) as constituent atoms. As a starting gas for introduction of carbon atoms in sputtering, there may be employed a starting gas for introduction of carbon atoms in the case of glow discharge as mentioned above.

In the present invention, as a diluting gas for forming an amorphous layer according to the glow discharge method or the sputtering method, there may be preferably mentioned so called rare gases such as He, Ne, Ar, and the like.

For forming a second layer region constituting the amorphous layer, a gaseous or a gasifiable starting material for introduction of the atoms of the group III may be introduced under gaseous state together with a starting material for forming an amorphous layer as mentioned above into a vacuum deposition chamber.

The content of the atoms of the group III to be introduced into the second layer region can be freely controlled by controlling the gas flow amounts, the gas flow amount ratios of the starting materials for introducing the atoms of the group III, discharging power, and the like.

As an effective starting materails for introducing the atoms of the group III, there may be included boron hydrides such as $B_2H_6$, $B_4H_{10}$, $B_5H_9$, $B_5H_{11}$, $B_6H_{10}$, $B_6H_{12}$, $B_6H_{14}$, and the like, and boron halides such as $BF_3$, $BCl_3$, $BBr_3$, and the like. In addition, there may also be employed $AlCl_3$, $GaCl_3$, $InCl_3$, $TlCl_3$ and the like.

In the photoconductive member according to the present invention, when nitrogen atoms are contained in a first layer region, there may also be incorporated oxygen atoms in the first layer region. By incorporating chemically oxygen atoms into the first layer region, adhesion between the amorphous layer and the support can be further improved, simultaneously with further increase in dark resistance.

For incorporation of oxygen atoms into the first layer region, a starting material for introduction of oxygen atoms as mentioned above may be introduced under a gaseous state into a vacuum deposition device during formation of the first layer region.

Alternatively, when a first layer region is formed according to a reactive sputtering method, oxygen atoms can be incorporated into the first layer region by using an $SiO_2$ target or a target containing $SiO_2$ mixed with Si, $Si_3N_4$ and the like.

In the photoconductive member according to the present invention, when carbon atoms are contained in a first layer region, there may be also incorporated either one or both of oxygen atoms and nitrogen atoms in the first layer region. By incorporating chemically oxygen atoms into the first layer region, adhesion between the amorphous layer and the support can be further improved, simultaneously with further increase in dark resistance. Introduction of nitrogen atoms will also promote the improvement in photosensitivity in the first layer region. For incorporation of oxygen atoms or nitrogen atoms into the first layer region, a starting material for introduction of oxygen atoms or a starting material for introduction of nitrogen atoms as mentioned above may be introduced under a gaseous state into a vacuum deposition device during formation of the first layer region.

Alternatively, when forming a first layer region according to the reactive sputtering method, oxygen atoms or nitrogen atoms can be incorporated into the first layer region formed, by using an $SiO_2$ target or a target containing $SiO_2$ mixed with Si, $Si_3N_4$, and the like for incorporation of oxygen atoms, or by using an $Si_3N_4$ target or a target containing $Si_3N_4$ mixed with Si, C, and the like for incorporation of nitrogen atoms.

A process for producing the photoconductive member according to a glow discharge decomposition method will be described below.

Figure 2:
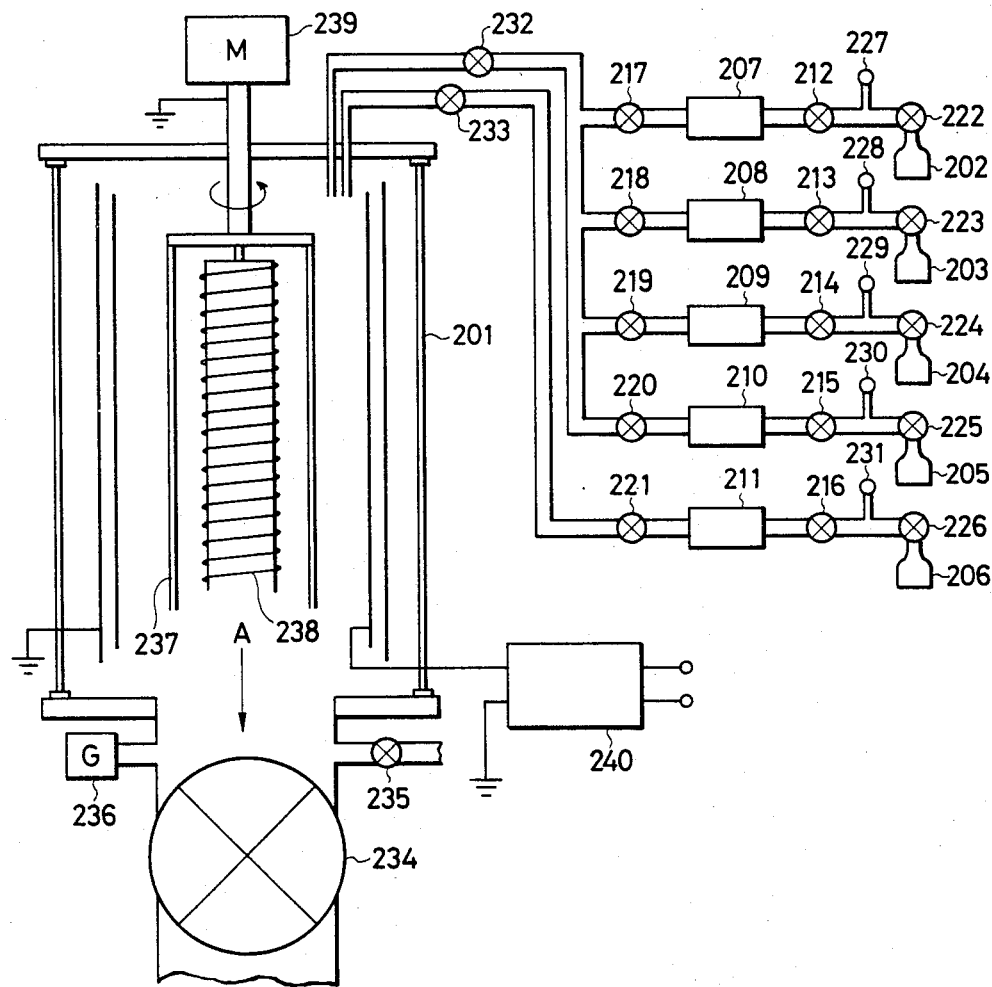
FIG. 2 shows a schematic flow charts for illustration of one example of device for preparation of the photoconductive member according to the present invention.

FIG. 2 shows a device for producing a photoconductive member according to a glow discharge decomposition method.

In the gas bombs 202, 203, 204, 205 and 206, there are hermetically contained starting gases for formation of respective layers. For example, 202 is a bomb containing $SiH_4$ gas diluted with He (purity: 99.999%, hereinafter abbreviated as $SiH_4$/He), 203 is a bomb containing $B_2H_6$ gas diluted with He (purity: 99.999%, hereinafter abbreviated as $B_2H_6$/He), 204 is a bomb containing $Si_2H_6$ gas diluted with He (purity: 99.99%, hereinafter abbreviated as $Si_2H_6$/He), 205 is a bomb containing $SiF_4$ gas diluted with He (purity: 99.999%, hereinafter abbreviated as $SiF_4$/He), and 206 is a bomb containing NO gas, $NH_3$ gas or CO gas.

For allowing these gases to flow into the reaction chamber 201, after confirmation of the valves 222-226 of the gas bombs 202-206 and the leak valve 235 to be closed, and the inflow valves 212-216, the outflow valves 217-221 and auxiliary valves 232-233 to be opened, the main valve 234 is first opened to evacuate the reaction chamber 201 and the gas pipelines. As the next step, when the reading on the vacuum indicator 236 becomes $5 \times 10^{-6}$ Torr, the auxiliary valves 232-233 and the outflow valves 217-221 are closed.

Referring now to an example of forming a first layer region constituting a part of an amorphous layer on a substrate cylinder 237, $SiH_4$/He gas from the gas bomb 202, $B_2H_6$/He gas from the gas bomb 203 and NO gas from the gas bomb 206 are permitted to flow into the mass-flow controllers 207, 208 and 211 by opening the valves 222, 223 and 226 to control the pressures at the outlet pressure gauges 227, 228 and 231 to 1 Kg/cm² and opening gradually the inflow valves 212, 213 and 216. Subsequently, the outflow valves 217, 218 and 221, auxiliary valves 232 and 233 are gradually opened to permit respective gases to flow into the reaction chamber 201. The outflow valves 217, 218 and 221 are controlled so that the flow amount ratio of $SiH_4$/He:$B_2H_6$/He:NO gases may have a desired value, and opening of the main valve 234 is also controlled while watching the reading on the vacuum indicator 236 so that the pressure in the reaction chamber may reach a desired value. And, after confirming that the temperature of the substrate cylinder 237 is set at 50°-400° C. by the heater 238, the power source 240 is set at a desired power to excite a glow discharge in the reaction chamber 201, thereby forming a first layer region on the substrate cylinder.

For formation of a first layer region containing nitrogen atoms or carbon atoms, $NH_3$ gas or CO gas may be employed in place of NO gas in the above example for formation of the first layer region.

For formation of the upper layer region on the first layer region formed on the substrate cylinder, the layer formation is effected by omitting the oxygen atom containing gas, nitrogen atom containing gas and carbon atom containing gas employed in formation of the first layer region.

All the outflow valves other than those necessary for the gases in formation of respective layers are, of course, closed, and during formation of respective layers, in order to prevent the gas used in the precedent layer from remaining in the reaction chamber 201 and pipelines from the outflow valves 217-221 to the reaction chamber 201, there may be conducted the procedure comprising once evacuating to a high vacuum the system by closing the outflow valves 217-221 and opening the auxiliary valves 232 and 233 with full opening of the main valve 234, if necessary.

During formation of the layer, the substrate cylinder 237 may be rotated at a constant speed by means of a motor 239 in order to effect a uniform layer formation.

The photoconductive member of the present invention designed to have layer constitution as described above can overcome all of the problems as described above and exhibit very excellent electrical, optical, photoconductive characteristics as well as good environmental characteristics in use.

In particular, when it is used as an image forming member for electrophotography, it is excellent in charge retaining ability during a charging treatment with no influence of residual potential on image formation at all, being stable in its electrical properties with high sensitivity and having high SN ratio as well as excellent light fatigue resistance, excellent repeated usage characteristics, especially markedly excellent repeated usage characteristics in a highly humid atmosphere, whereby it is possible to obtain a visible image of high quality with high density, clear halftone and high resolution.

The present invention is further illustrated by referring to the following Examples.

EXAMPLE 1

Layers were formed on an Al cylinder by means of the preparation device as shown in FIG. 2 under the following conditions.

TABLE 1

| | Gases employed | Flow amount (SCCM) | Flow amount ratio | Discharging power (W/cm$^2$) | Layer deposition rate (Å/s) | Layer thickness ($\mu$) |
|---|---|---|---|---|---|---|
| First layer region | $SiH_4/He = 0.5$<br>NO<br>$B_2H_6/He = 10^{-3}$ | 200 | $NO/SiH_4 = 4 \times 10^{-2}$<br>$B_2H_6/SiH_4 = 8 \times 10^{-5}$ | 0.18 | 15 | 20 |
| Upper layer | $SiH_4/He = 0.5$ | 300 | | 0.18 | 15 | 0.15 |

Al cylinder temperature: 250° C.
Discharging frequency: 13.56 MHz
Back pressure in reaction chamber: 0.5 Torr The thus prepared image forming member was set in an experimental device for charging exposure, and corona charging was effected as ⊕5.0 kV for 0.2 second, followed immediately by irradiation of a light image from a tungsten lamp source at a dose of 1.5 lux.sec through a transmissive type test chart.

Immediately thereafter, by cascading on the member surface with ⊖ charged developer (containing toner and carrier), a good toner image was obtained on the member surface. When the toner image on the member was transferred to a transfer paper by corona charging at ⊕5.0 kV, there was obtained a clear image of high density excellent in resolution with good gradation reproducibility.

EXAMPLE 2

Layers were formed on an Al cylinder by means of the preparation device as shown in FIG. 2 under the following conditions.

TABLE 2

| | Gases employed | Flow amount (SCCM) | Flow amount ratio | Discharging power (W/cm$^2$) | Layer deposition rate (Å/s) | Layer thickness ($\mu$) |
|---|---|---|---|---|---|---|
| First layer region | $SiH_4/He = 0.5$<br>NO<br>$B_2H_6/He = 10^{-3}$ | 200 | $NO/SiH_4 = 1.3 \times 10^{-2}$<br>$B_2H_6/SiH_4 = 8 \times 10^{-5}$ | 0.18 | 13 | 20 |
| Upper layer | $SiH_4/He = 0.5$<br>$B_2H_6/He = 10^{-3}$ | 200 | $B_2H_6/SiH_4 = 1 \times 10^{-5}$ | 0.18 | 11 | 0.15 |

Other conditions were the same as in Example 1.

Using the thus prepared image forming member, image formation was effected on a transfer paper according to the same procedure and under the same conditions as in Example 1, whereby a very clear image quality was obtained.

EXAMPLE 3

The first layer region and the upper layer were formed under the same conditions as in Example 1 except that the flow amount ratio of $NO/SiH_4$ was changed to $6 \times 10^{-2}$ to prepare an image forming member, and an image was formed on a transfer paper using this image forming member according to the same procedure under the same conditions as in Example 1 to give a very clear image.

EXAMPLE 4

Layers were formed on an Al cylinder by means of the preparation device as shown in FIG. 2 under the following conditions.

TABLE 3

| | Gases employed | Flow amount (SCCM) | Flow amount ratio | Discharging power (W/cm$^2$) | Layer deposition rate (Å/s) | Layer thickness ($\mu$) |
|---|---|---|---|---|---|---|
| First layer region | $SiH_4/He = 0.5$<br>$SiF_4/He = 0.5$<br>NO | 200 | $SiF_4/SiH_4 = 0.2$<br>$NO/SiF_4 + SiH_4 = 7 \times 10^{-2}$ | 0.25 | 20 | 25 |

TABLE 3-continued

| | Gases employed | Flow amount (SCCM) | Flow amount ratio | Discharging power (W/cm$^2$) | Layer deposition rate (Å/s) | Layer thickness ($\mu$) |
|---|---|---|---|---|---|---|
| Upper layer | $B_2H_6/He = 10^{-3}$<br>$SiH_4/He = 0.5$ | 300 | $B_2H_6/SiF_4 + SiH_4 = 4 \times 10^{-5}$<br>— | 0.18 | 15 | 0.2 |

Other conditions were the same as in Example 1.

Using the thus prepared image forming member, image formation was effected on a transfer paper according to the same procedure and under the same conditions as in Example 1, whereby a very clear image quality was obtained.

EXAMPLE 5

In place of the SiH$_4$/He gas bomb used in Example 1, Si$_2$H$_6$/He gas bomb was used to perform layer formation on an Al cylinder by means of the device as shown in FIG. 2 under the following conditions.

TABLE 4

| | Gases employed | Flow amount (SCCM) | Flow amount ratio | Discharging power (W/cm$^2$) | Layer deposition rate (Å/s) | Layer thickness ($\mu$) |
|---|---|---|---|---|---|---|
| First layer region | $Si_2H_6/He = 1.0$<br>NO<br>$B_2H_6/He = 10^{-3}$ | 200 | $NO/Si_2H_6 = 3 \times 10^{-2}$<br>$B_2H_6/Si_2H_6 = 8 \times 10^{-5}$ | 0.9 | 50 | 20 |
| Upper layer | $Si_2H_6/He = 1.0$ | 200 | — | 0.8 | 45 | 0.2 |

Other conditions were the same as in Example 1.

Using the thus prepared image forming member, image formation was effected on a transfer paper according to the same procedure and under the same conditions as in Example 1, whereby a very clear image quality was obtained.

EXAMPLE 6

On an Al cylinder having an Al$_2$O$_3$ layer of 800 Å thick produced by an anodic oxidation method, the first region layer and the upper layer were formed according to the same procedure and under the same conditions as in Example 1 to prepare an image forming member.

By using the thus prepared image forming member, image formation was effected on a transfer paper according to the same procedure under the same conditions as in Example 1, whereby a very clear image quality was obtained.

EXAMPLE 7

Layers were formed on an Al cylinder by means of the preparation device as shown in FIG. 2 under the following conditions.

TABLE 5

| | Gases employed | Flow amount (SCCM) | Flow amount ratio | Discharging power (W/cm$^2$) | Layer deposition rate (Å/s) | Layer thickness ($\mu$) |
|---|---|---|---|---|---|---|
| First layer region | $SiH_4/He = 0.5$<br>$NH_3$<br>$B_2H_6/He = 10^{-3}$ | 200 | $NH_3/SiH_4 = 3 \times 10^{-1}$<br>$B_2H_6/SiH_4 = 5 \times 10^{-4}$ | 0.18 | 15 | 20 |
| Upper layer | $SiH_4/He = 0.5$ | 300 | — | 0.18 | 15 | 0.15 |

Al cylinder temperature: 250° C.
Discharging frequency: 13.56 MHz
Back pressure in reaction chamber: 0.5 Torr The thus prepared image forming member was set in an experimental device for charging exposure, and corona charging was effected at ⊕5.0 kV for 0.2 second, followed immediately by irradiation of a light image from a tungsten lamp source at a dose of 1.5 lux.sec through a transmissive type test chart.

Immediately thereafter, by cascading on the member surface with ⊖ charged developer (containing toner and carrier), a good toner image was obtained on the member surface. When the toner image on the member was transferred to a transfer paper by corona charging at ⊕5.0 kV, there was obtained a clear image of high density excellent in resolution with good gradation reproducibility.

EXAMPLE 8

Layers were formed on an Al cylinder by means of the preparation device as shown in FIG. 2 under the following conditions.

TABLE 6

| | Gases employed | Flow amount (SCCM) | Flow amount ratio | Discharging power (W/cm$^2$) | Layer deposition rate (Å/s) | Layer thickness ($\mu$) |
|---|---|---|---|---|---|---|
| First layer region | $SiH_4/He = 0.5$<br>$NH_3$<br>$B_2H_6/He = 10^{-3}$ | 200 | $NH_3/SiH_4 = 1 \times 10^{-1}$<br>$B_2H_6/SiH_4 = 5 \times 10^{-4}$ | 0.18 | 13 | 20 |
| Upper layer | $SiH_4/He = 0.5$<br>$B_2H_6/He = 10^{-3}$ | 200 | $B_2H_6/SiH_4 = 1 \times 10^{-5}$ | 0.18 | 11 | 0.15 |

Other conditions were the same as in Example 7.

Using the thus prepared image forming member, image formation was effected on a transfer paper according to the same procedure and under the same conditions as in Example 7, whereby a very clear image quality was obtained.

EXAMPLE 9

The first layer region and the upper layer were formed under the same conditions as in Example 7 except that the flow amount ratio of $B_2H_6/SiH_4$ was changed to $1.0 \times 10^{-3}$ to prepare an image forming member, and an image was formed on a transfer paper using this image forming member according to the same procedure under the same conditions as in Example 7 to give a very clear image.

EXAMPLE 10

Layers were formed on an Al cylinder by means of the preparation device as shown in FIG. 2 under the following conditions.

TABLE 7

| | Gases employed | Flow amount (SCCM) | Flow amount ratio | Discharging power (W/cm$^2$) | Layer deposition rate (Å/s) | Layer thickness (μ) |
|---|---|---|---|---|---|---|
| First layer region | $SiH_4/He = 0.5$<br>$SiF_4/He = 0.5$<br>$NH_3$<br>$B_2H_6/He = 10^{-3}$ | 200 | $SiF_4/SiH_4 = 0.2$<br>$NH_3/SiF_4 + SiH_4 = 5 \times 10^{-1}$<br>$B_2H_6/SiF_4 + SiH_4 = 2 \times 10^{-4}$ | 0.25 | 0 | 25 |
| Upper layer | $SiH_4/He = 0.5$ | 300 | — | 0.18 | 15 | 0.2 |

Other conditions were the same as in Example 7.

By using the thus prepared image forming member, image formation was effected on a transfer paper according to the same procedure and under the same conditions as in Example 7, whereby a very clear image quality was obtained.

EXAMPLE 11

In place of the $SiH_4/He$ gas bomb used in Example 7, $Si_2H_6/He$ gas bomb was used to perform the layer formation on Al cylinder by means of the device as shown in FIG. 2 under the following conditions.

TABLE 8

| | Gases employed | Flow amount (SCCM) | Flow amount ratio | Discharging power (W/cm$^2$) | Layer deposition rate (Å/s) | Layer thickness (μ) |
|---|---|---|---|---|---|---|
| First layer region | $Si_2H_6/He = 1.0$<br>$NH_3$<br>$B_2H_6/He = 10^{-3}$ | 200 | $NH_3/Si_2H_6 = 3 \times 10^{-1}$<br>$B_2H_6/Si_2H_6 = 5 \times 10^{-4}$ | 0.9 | 50 | 20 |
| Upper layer | $Si_2H_6/He = 1.0$ | 200 | — | 0.8 | 45 | 0.2 |

Other conditions were the same as in Example 7.

By using the thus prepared image forming member, image formation was effected on a transfer paper according to the same procedure and under the same conditions as in Example 7, whereby a very clear image quality was obtained.

EXAMPLE 12

On an Al cylinder having an $Al_2O_3$ layer of 800 Å thick produced by an anodic oxidation method, the first region layer and the upper layer were formed according to the same procedure under the same conditions as in Example 7 to prepare an image forming member.

By using the thus prepared image forming member, image formation was effected on a transfer paper according to the same procedure under the same conditions as in Example 7, whereby a very clear image quality was obtained.

EXAMPLE 13

By means of the preparation device as shown in FIG. 2, layers were formed on an Al cylinder under the following conditions.

TABLE 9

| | Gases employed | Flow amount (SCCM) | Flow amount ratio | Discharging power (W/cm$^2$) | Layer deposition rate (Å/s) | Layer thickness (μ) |
|---|---|---|---|---|---|---|
| First layer region | $SiH_4/He = 0.5$<br>$NH_3$<br>$NO$<br>$B_2H_6/He = 10^{-3}$ | 200 | $NH_3/SiH_4 = 6 \times 10^{-2}$<br>$NO/SiH_4 = 8 \times 10^{-3}$<br>$B_2H_6/SiH_4 = 1 \times 10^{-4}$ | 0.18 | 15 | 20 |
| Upper layer | $SiH_4/He = 0.5$ | 300 | — | 0.18 | 15 | 0.15 |

Al cylinder temperature: 250° C.
Discharging frequency: 13.56 MHz
Back pressure in reaction chamber: 0.5 Torr The thus prepared image forming member was set in an experimental device for charging exposure and corona charging was effected at ⊕5.0 kV for 0.2 seccond, followed immediately by irradiation of a light image from a tungsten lamp source at a dose of 1.5 lux.sec through a transmissive type test chart.

Immediately thereafter, by cascading on the member surface with ⊖ charged developer (containing toner and carrier), a good toner image was obtained on the member surface. When the toner image on the member was transferred to a transfer paper by corona charging at ⊕5.0 kV, there was obtained a clear image of high density excellent in resolution with good gradation reproducibility.

EXAMPLE 14

Layers were formed on an Al cylinder by means of the preparation device as shown in FIG. 2 under the following conditions.

TABLE 10

| | Gases employed | Flow amount (SCCM) | Flow amount ratio | Discharging power (W/cm$^2$) | Layer deposition rate (Å/s) | Layer thickness (μ) |
|---|---|---|---|---|---|---|
| First layer region | $SiH_4/He = 0.5$ $CH_4$ $B_2H_6/He = 10^{-3}$ | 200 | $CH_4/SiH_4 = 8.0 \times 10^{-2}$ $B_2H_6/SiH_4 = 1.0 \times 10^{-4}$ | 0.18 | 15 | 20 |
| Upper layer | $SiH_4/He = 0.5$ | 300 | — | 0.18 | 15 | 0.15 |

Al cylinder temperature: 250° C.
Discharging frequency: 13.56 MHz
Back pressure in reaction chamber: 0.5 Torr The thus prepared image forming member was set in an experimental device for charging exposure and corona charging was effected at ⊕ 5.0 kV for 0.2 second, followed immediately by irradiation of a light image from a tungsten lamp source at a dose of 1.5 lux.sec through a transmissive type test chart.

Immediately thereafter, by cascading on the member surface with ⊖ charged developer (containing toner and carrier), a good toner image was obtained on the member surface. When the toner image on the member surface was transferred to a transfer paper by corona charging at ⊕ 5.0 kV, there was obtained a clear image of high density excellent in resolution with good gradation reproducibility.

EXAMPLE 15

Layers were formed on an Al cylinder by means of the preparation device as shown in FIG. 2 under the following conditions.

TABLE 11

| | Gases employed | Flow amount (SCCM) | Flow amount ratio | Discharging power (W/cm$^2$) | Layer deposition rate (Å/s) | Layer thickness (μ) |
|---|---|---|---|---|---|---|
| First layer region | $SiH_4/He = 0.5$ $CH_4$ $B_2H_6/He = 10^{-3}$ | 200 | $CH_4/SiH_4 = 3.0 \times 10^{-2}$ $B_2H_6/SiH_4 = 1.0 \times 10^{-4}$ | 0.18 | 13 | 20 |
| Upper layer | $SiH_4/He = 0.5$ $B_2H_6/He = 10^{-3}$ | 200 | $B_2H_6/SiH_4 = 1 \times 10^{-5}$ | 0.18 | 11 | 0.15 |

Other conditions were the same as in Example 14.

Using the thus prepared image forming member, image formation was effected on a transfer paper according to the same procedure and under the same conditions as in Example 14, whereby a very clear image quality was obtained.

EXAMPLE 16

The first layer region and the upper layer were formed under the same conditions as in Example 14 except that the flow amount ratio of $CH_4/SiH_4$ was changed to $2 \times 10^{-1}$ to prepare an image forming member, and an image was formed on a transfer paper according to the same procedure under the same conditions as in Example 14 to give a very clear image.

EXAMPLE 17

Layers were formed on an Al cylinder by means of the preparation device as shown in FIG. 2 under the following conditions.

TABLE 12

| | Gases employed | Flow amount (SCCM) | Flow amount ratio | Discharging power (W/cm$^2$) | Layer deposition rate (Å/s) | Layer thickness (μ) |
|---|---|---|---|---|---|---|
| First layer region | $SiH_4/He = 0.5$ $SiF_4/He = 0.5$ $CH_4$ $B_2H_6/He = 10^{-3}$ | 200 | $SiF_4/SiH_4 = 0.2$ $CH_4/SiF_4 + SiH_4 = 1 \times 10^{-1}$ $B_2H_6/SiF_4 + SiH_4 = 6 \times 10^{-5}$ | 0.25 | 20 | 25 |
| Upper layer | $SiH_4/He = 0.5$ | 300 | — | 0.18 | 15 | 0.2 |

Other conditions were the same as in Example 14.

By using the thus prepared image forming member, image formation was effected on a transfer paper according to the same procedure and under the same conditions as in Example 14, whereby a very clear image quality was obtained.

EXAMPLE 18

In place of the $SiH_4/He$ gas bomb used in Example 14, $Si_2H_6/He$ gas bomb was used to perform layer formation on an Al cylinder by means of the device as shown in FIG. 2 under the following conditions.

TABLE 13

| | Gases employed | Flow amount (SCCM) | Flow amount ratio | Discharging power (W/cm$^2$) | Layer deposition rate (Å/s) | Layer thickness (μ) |
|---|---|---|---|---|---|---|
| First | $Si_2H_6/He = 1.0$ | 200 | $CH_4/Si_2H_6 = 6 \times 10^{-2}$ | 0.9 | 50 | 20 |

TABLE 13-continued

| | Gases employed | Flow amount (SCCM) | Flow amount ratio | Discharging power (W/cm$^2$) | Layer deposition rate (Å/s) | Layer thickness ($\mu$) |
|---|---|---|---|---|---|---|
| layer region | CH$_4$ B$_2$H$_6$/He = 10$^{-3}$ | | B$_2$H$_6$/Si$_2$H$_6$ = 1 × 10$^{-4}$ | | | |
| Upper layer | Si$_2$H$_6$/He = 1.0 | 200 | — | 0.8 | 45 | 0.2 |

Other conditions were the same as in Example 14.

By using the thus prepared image forming member, image formation was effected on a transfer paper according to the same procedure and under the same conditions as in Example 14, whereby a very clear image quality was obtained.

On an Al cylinder having an Al$_2$O$_3$ layer of 800 Å thick produced by an anodic oxidation method, the first region layer and the upper layer were formed according to the same procedure under the same conditions as in Example 14 to prepare an image forming member.

By using the thus prepared image forming member, image formation was effected on a transfer paper according to the same procedure under the same conditions as in Example 14, whereby a very clear image quality was obtained.

EXAMPLE 20

By means of the preparation device as shown in FIG. 2, layers were formed on an Al cylinder under the following conditions.

TABLE 14

| | Gases employed | Flow amount (SCCM) | Flow amount ratio | Discharging power (W/cm$^2$) | Layer deposition rate (Å/s) | Layer thickness ($\mu$) |
|---|---|---|---|---|---|---|
| First layer region | SiH$_4$/He = 0.5 CH$_4$ NO B$_2$H$_6$/He = 10$^{-3}$ | 200 | CH$_4$/SiH$_4$ = 1 × 10$^{-2}$ NO/SiH$_4$ = 4 × 10$^{-3}$ B$_2$H$_6$/SiH$_4$ = 1 × 10$^{-4}$ | 0.18 | 15 | 20 |
| Upper layer | SiH$_4$/He = 0.5 | 300 | — | 0.18 | 15 | 0.15 |

Al cylinder temperature: 250°0 C.
Discharging frequency: 13.56 MHz
Back pressure in reaction chamber: 0.5 Torr The thus prepared image forming member was set in an experimental device for charging exposure and corona charging was effected at ⊕ 5.0 kV for 0.2 second, followed immediately by irradiation of a light image from a tungsten lamp source at a dose of 1.5 lux.sec through a transmissive type test chart.

Immediately thereafter, by cascading on the member surface with ⊖ charged developer (containing toner and carrier), a good toner image was obtained on the member surface. When the toner image on the member was transferred to a transfer paper by corona charging at ⊕ 5.0 kV, there was obtained a clear image of high density excellent in resolution with good gradation reproducibility.

EXAMPLE 21

By means of the preparation device as shown in FIG. 2, layers were formed on an Al cylinder under the following conditions.

TABLE 15

| | Gases employed | Flow amount (SCCM) | Flow amount ratio | Discharging power (W/cm$^2$) | Layer deposition rate (Å/s) | Layer thickness ($\mu$) |
|---|---|---|---|---|---|---|
| First layer region | SiH$_4$/He = 0.5 CH$_4$ NH$_3$ B$_2$H$_6$/He = 10$^{-3}$ | 200 | CH$_4$/SiH$_4$ = 1 × 10$^{-2}$ NH$_3$/SiH$_4$ = 2 × 10$^{-2}$ B$_2$H$_6$/SiH$_4$ = 1 × 10$^{-4}$ | 0.18 | 15 | 20 |
| Upper layer | SiH$_4$/He = 0.5 | 300 | — | 0.18 | 15 | 0.15 |

Al cylinder temperature: 250° C.
Discharging frequency: 13.56 MHz
Back pressure in reaction chamber: 0.5 Torr The thus prepared image forming member was set in an experimental device for charging exposure and corona charging was effected at ⊕ 5.0 kV for 0.2 second, followed immediately by irradiation of a light image from a tungsten lamp source at a dose of 1.5 lux.sec through a transmissive type test chart.

Immediately thereafter, by cascading on the member surface with ⊖ charged developer (containing toner and carrier), a good toner image was obtained on the member surface. When the toner image on the member was transferred to a transfer paper by corona charging at ⊕ 5.0 kV, there was obtained a clear image of high density excellent in resolution with good gradation reproducibility.

EXAMPLE 22

By means of the preparation device as shown in FIG. 2, layers were formed on an Al cylinder under the following conditions.

TABLE 16

| | Gases employed | Flow amount (SCCM) | Flow amount ratio | Discharging power (W/cm$^2$) | Layer deposition rate (Å/s) | Layer thickness ($\mu$) |
|---|---|---|---|---|---|---|
| First layer region | SiH$_4$/He = 0.5<br>CH$_4$<br>NH$_3$<br>B$_2$H$_6$/He = 10$^{-3}$ | 200 | CH$_4$/SiH$_4$ = 6 × 10$^{-3}$<br>NO/SiH$_4$ = 2 × 10$^{-3}$<br>NH$_3$/SiH$_4$ = 8 × 10$^{-3}$<br>B$_2$H$_6$/SiH$_4$ = 1 × 10$^{-4}$ | 0.18 | 15 | 20 |
| Upper layer | SiH$_4$/He = 0.5 | 300 | — | 0.18 | 15 | 0.15 |

Al cylinder temperature: 250° C.
Discharging frequency: 13.56 MHz
Back pressure in reaction chamber: 0.5 Torr The thus prepared image forming member was set in an experimental device for charging exposure and corona charging was effected at ⊕ 5.0 kV for 0.2 second, followed immediately by irradiation of a light image from a tungsten lamp source at a dose of 1.5 lux.sec through a transmissive type test chart.

Immediately thereafter, by cascading on the member surface with ⊖ charged developer (containing toner and carrier), a good toner image was obtained on the member surface. When the toner image on the member was transferred to a transfer paper by corona charging at ⊕ 5.0 kV, there was obtained a clear image of high density excellent in resolution with good gradation reproducibility.

What we claim is:

1. A photoconductive member comprising a support for a photoconductive member and an amorphous layer having photoconductivity constituted of an amorphous material comprising silicon atoms as a matrix, characterized in that said amorphous layer has a first layer region containing at least one kind of atoms selected from the group consisting of oxygen atoms, nitrogen atoms and carbon atoms as constituent atoms and a second layer region containing atoms of an element belonging to the group III of the periodic table as constituent atoms, said first layer region existing internally within said amorphous layer below the surface of said amorphous layer wherein the amorphous layer contains at least one of hydrogen atoms and halogen atoms as constituent atoms.

2. A photoconductive member according to claim 1, wherein the amorphous layer contains hydrogen atoms as constituent atoms.

3. A photoconductive member according to claim 2, wherein the amorphous layer contains hydrogen atoms in an amount of 1 to 40 atomic %.

4. A photoconductive member according to claim 1, wherein the amorphous layer contains halogen atoms as constituent atoms.

5. A photoconductive member according to claim 4, wherein the amorphous layer contains halogen atoms in an amount of 1 to 40 atomic %.

6. A photoconductive member according to claim 4, wherein the halogen atoms are fluorine atoms.

7. A photoconductive member according to claim 1, wherein the first layer region and the second layer region has at least a part thereof common to each other.

8. A photoconductive member according to claim 1, wherein the first layer region and the second layer region are substantially the identical region.

9. A photoconductive member according to claim 1, wherein the first layer region contains oxygen atoms.

10. A photoconductive member according to claim 9, wherein the oxygen atoms are present in an amount of 0.01 to 20 atomic % in the first layer region.

11. A photoconductive member according to claim 1, wherein the first layer region contains nitrogen atoms.

12. A photoconductive member according to claim 11, wherein the nitrogen atoms are present in an amount of 0.01 to 20 atomic % in the first layer region.

13. A photoconductive member according to claim 1, wherein the first layer region contains carbon atoms.

14. A photoconductive member according to claim 13, wherein the carbon atoms are present in an amount of 0.01 to 20 atomic % in the first layer region.

15. A photoconductive member according to claim 1, wherein the first layer region has a thickness of 3 to 100$\mu$.

16. A photoconductive member according to claim 1, wherein the layer region not containing the selected atoms in the first layer region which exists on the first layer region has a thickness of 0.02 to 10$\mu$.

17. A photoconductive member comprising a support for a photoconductive member and an amorphous layer having photoconductivity constituted of an amorphous material comprising silicon atoms as a matrix, characterized in that said amorphous layer has, in the order from the support side, a first layer region containing at least one kind of atoms selected from the group consisting of oxygen atoms, nitrogen atoms and carbon atoms as constituent atoms and an upper layer region provided in direct contact with said first layer region and containing no atom selected in said first layer region, and a second layer region containing atoms of an element belonging to the group III of the periodic table as constituent atoms is provided such that at least a part of the second layer region overlaps at least one of said first layer region and said upper layer region wherein the amorphous layer contains at least one of hydrogen atoms and halogen atoms as constituent atoms.

18. A photoconductive member according to claim 17, wherein the amorphous layer contains hydrogen atoms as constituent atoms.

19. A photoconductive member according to claim 18, wherein the amorphous layer contains hydrogen atoms in an amount of 1 to 40 atomic %.

20. A photoconductive member according to claim 17, wherein the amorphous layer contains halogen atoms as constituent atoms.

21. A photoconductive member according to claim 20, wherein the amorphous layer contains halogen atoms in an amount of 1 to 40 atomic %.

22. A photoconductive member according to claim 20, wherein the halogen atoms are fluorine atoms.

23. A photoconductive member according to claim 17, wherein the first layer region contains oxygen atoms.

24. A photoconductive member according to claim 23, wherein the oxygen atoms are present in an amount of 0.01 to 20 atomic % in the first layer region.

25. A photoconductive member according to claim 17, wherein the first layer region contains nitrogen atoms.

26. A photoconductive member according to claim 25, wherein the nitrogen atoms are present in an amount of 0.01 to 20 atomic % in the first layer region.

27. A photoconductive member according to claim 17, wherein the first layer region contains carbon atoms.

28. A photoconductive member according to claim 27, wherein the carbon atoms are present in an amount of 0.01 to 20 atomic % in the first layer region.

29. A photoconductive member according to claim 17, wherein the first layer region has a thickness of 3 to 100μ.

30. A photoconductive member according to claim 17, wherein the upper layer region existing on the first layer region has a thickness of 0.02 to 10μ.

31. A photoconductive member according to claim 1 or 17, wherein the atoms of an element belonging to the group III of the periodic table are selected from the group consisting of B, Al, Ga, In and Tl.

32. A photoconductive member according to claim 1 or 17, wherein the content of the atoms of an element belonging to the group III of the periodic table contained in the second layer region is $0.01-5 \times 10^4$ atomic ppm.

33. A photoconductive member according to claim 1 or 17, wherein the content of the atoms of an element belonging to the group III of the periodic table contained in the second layer region is 1-100 atomic ppm.

34. A photoconductive member according to claim 1 or 17, wherein the layer thickness of the first layer region is 3-100μ.

35. A photoconductive member according to claim 1 or 17, wherein the amorphous layer has a layer region containing no atom of an element belonging to the group III of the periodic table in the upper portion.

36. A photoconductive member according to claim 1 or 17, wherein the support is in a belt like form.

37. A photoconductive member according to claim 1 or 17, wherein the support is in a cylindrical form.

38. A photoconductive member according to claim 1 or 17, wherein the support is a synthetic resin sheet provided with electroconductivity at the surface.

39. A photoconductive member according to claim 1 or 17, comprising further a barrier layer between the support and the amorphous layer.

40. A photoconductive member according to claim 1 or 17, comprising further an intermediate layer comprising a metal oxide between the support and the amorphous layer.

41. A photoconductive member according to claim 40, wherein the metal oxide is $Al_2O_3$.

* * * * *

UNITED STATES PATENT AND TRADEMARK OFFICE
CERTIFICATE OF CORRECTION

PATENT NO. : 4,536,460

DATED : August 20, 1985

INVENTOR(S) : Junichiro Kanbe, et al.

It is certified that error appears in the above-identified patent and that said Letters Patent is hereby corrected as shown below:

Column 1, line 11, "Prior Arts" should be --Prior Art--.
Column 2, line 61, "surpass" should be --surpasses--.
Column 3, line 34, "exsisting" should be --existing--.
Column 3, line 42, "flow charts" should be --flow chart--.
Column 8, line 54, "dioxide ($No_2$)," should be --dioxide ($NO_2$),--
Column 10, line 34, "$Si_3N_4$ used" should be --$Si_3N_4$ is used--.
Column 11, line 23, "As an effective starting matérails" should be --As effective starting materials--.
Column 12, line 2, "an $Si_3n4$" should be --an $Si_3N_4$--.
TABLE 7, under "Layer Deposition Rate", "0" should be --20--.
Column 21, line 16, After "image quality was obtained." on new line insert --EXAMPLE 19--.
Column 23, Table 16, under "Gases employed" between "$CH_4$" and "$NH_3$" insert --NO--.
Column 23, line 60, "has" should be --have--.

Signed and Sealed this

Ninth Day of December, 1986

Attest:

DONALD J. QUIGG

Attesting Officer        Commissioner of Patents and Trademarks